US008254198B2

(12) United States Patent  (10) Patent No.: US 8,254,198 B2
Borot et al.  (45) Date of Patent: Aug. 28, 2012

(54) ANTI-FUSE ELEMENT

(75) Inventors: Bertrand Borot, Le Cheylas (FR); Michel Zecri, Bévenais (FR)

(73) Assignees: STMicroelectronics (Crolles 2) SAS, Crolles (FR); Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 12/679,278

(22) PCT Filed: Oct. 3, 2007

(86) PCT No.: PCT/IB2007/055366

§ 371 (c)(1),
(2), (4) Date: May 26, 2010

(87) PCT Pub. No.: WO2009/044237

PCT Pub. Date: Apr. 9, 2009

(65) Prior Publication Data

US 2010/0246237 A1  Sep. 30, 2010

(51) Int. Cl.
*G11C 17/18* (2006.01)
*G11C 17/00* (2006.01)
*H01H 37/76* (2006.01)

(52) U.S. Cl. .................. 365/225.7; 365/96; 327/525

(58) Field of Classification Search ............... 365/225.7
See application file for complete search history.

(56) References Cited

U.S. PATENT DOCUMENTS

| 4,686,384 | A  | * | 8/1987  | Harvey et al. ............... 327/530 |
| 5,163,180 | A  |   | 11/1992 | Eltoukhy et al. |
| 5,200,652 | A  | * | 4/1993  | Lee ................................ 326/47 |
| 5,327,024 | A  | * | 7/1994  | Cox ................................ 326/38 |
| 5,426,614 | A  | * | 6/1995  | Harward ..................... 365/225.7 |
| 6,041,009 | A  | * | 3/2000  | Kim et al. ................... 365/225.7 |
| 6,255,894 | B1 | * | 7/2001  | Cutter et al. .................. 327/525 |
| 6,307,423 | B1 |   | 10/2001 | Morton |
| 6,570,798 | B1 | * | 5/2003  | McCollum .................... 365/201 |
| 7,715,219 | B2 | * | 5/2010  | Monreal ......................... 365/96 |
| 2001/0006351 | A1 |   | 7/2001  | Cutter et al. |

OTHER PUBLICATIONS

International Search Report dated Jun. 20, 2008 from corresponding International Application No. PCT/IB2007/055366.

* cited by examiner

*Primary Examiner* — Son Mai

(74) *Attorney, Agent, or Firm* — Wolf, Greenfield & Sacks, P.C.

(57) ABSTRACT

Programmable anti-fuse circuitry including at least one anti-fuse cell having a first anti-fuse device coupled between a supply voltage and a first node and a second anti-fuse device coupled between the first node and a ground voltage, and control logic coupled to the first node and arranged to generate a programming voltage having one of at least a first voltage level for breaking-down the first anti-fuse device but not the second anti-fuse device and coupling the first node to the supply voltage; and a second voltage level for breaking-down the second anti-fuse device but not the first anti-fuse device and coupling the first node to the ground voltage.

10 Claims, 2 Drawing Sheets

ANTI-FUSE ELEMENT

CROSS REFERENCE TO RELATED APPLICATIONS

This application is a U.S. national stage patent application based on PCT application number PCT/IB2007/055366, entitled "Anti-Fuse Element", filed on Oct. 3, 2007 which application is hereby incorporated by reference to the maximum extent allowable by law.

BACKGROUND OF THE INVENTION

1. Field of the Invention

The present invention relates to anti-fuse circuitry, and in particular to programmable voltage controlled anti-fuse circuitry.

2. Background of the Invention

Fuses and anti-fuses are used in multiple applications to allow internal connections on an integrated circuit to be modified after the process flow has been completed. Such fuses may be programmed by a programming signal to change the state of the connection between two points. Whereas a fuse is a switch which is normally closed, and can be opened by programming such that no current flows through the fuse, an anti-fuse is a switch which is normally open, and can be closed by programming, such that the voltage across the anti-fuse becomes close to zero.

There are a number of different known types of fuses and anti-fuses. For example, a poly-silicon fuse comprises a region of poly-silicon that can be destroyed by an electrical signal. A drawback of this type of fuse is that it is unreliable, meaning that it may not keep its programmed state throughout its lifetime. A gate oxide anti-fuse is an anti-fuse essentially formed as a capacitor, having a dielectric which is broken by increasing a voltage across the electrodes of the capacitor. A drawback of this solution is that a high voltage is required to break-down the dielectric, higher than the normal voltages used on the integrated circuit, and thus requires specific technology adapted to function at the higher voltages. In many semiconductor technologies, such specific technology is not easily available. A laser fuse comprises a metal rod that can be destroyed by a laser. A drawback of such a fuse is that it cannot be programmed outside the process flow, in other words in the final application.

A further drawback of the above solutions is the chip area they consume, and their power consumption which is relatively high.

There is thus a need for a reliable solution without the drawbacks of these known solutions.

SUMMARY OF THE INVENTION

It is an aim of embodiments of the present invention to at least partially overcome one or more drawbacks in the prior art.

According to one aspect of the present invention, there is provided programmable anti-fuse circuitry comprising: at least one anti-fuse cell comprising a first anti-fuse device coupled between a supply voltage and a first node and a second anti-fuse device coupled between the first node and a ground voltage; and control logic coupled to the first node and arranged to generate a programming voltage having one of at least: a first voltage level for breaking-down said first anti-fuse device but not said second anti-fuse device and coupling said first node to said supply voltage; and a second voltage level for breaking-down said second anti-fuse device but not said first anti-fuse device and coupling said first node to said ground voltage.

According to one embodiment of the present invention, the programmable anti-fuse circuitry further comprises a MOS transistor having its gate coupled to said first node and arranged to sense the voltage at the first node.

According to another embodiment of the present invention, said first anti-fuse device comprises source and bulk regions coupled to said supply voltage and a drain region coupled to said first node, and wherein said second anti-fuse device comprises source and bulk regions coupled to said ground voltage and a drain region coupled to said first node.

According to another embodiment of the present invention, said first and second anti-fuse devices each comprise a gate coupled MOS device arranged such that said programming voltage causes snapback in one or the other of said gate coupled MOS devices.

According to another embodiment of the present invention, the first anti-fuse is formed of a gate-coupled p-channel MOS transistor, while the second anti-fuse is formed of a gate coupled n-channel MOS transistor.

According to another embodiment of the present invention, said supply voltage and ground voltage are chosen such that the voltage difference between said ground voltage and said supply voltage is lower than a minimum voltage for breaking-down either of said first and second anti-fuse devices, and wherein said first voltage level is lower than said ground voltage and said second voltage level is higher than said supply voltage.

According to another aspect of the present invention, there is provided a memory circuit comprising: a plurality of memory blocks; and the programmable anti-fuse circuitry described above, comprising at least one anti-fuse cell associated with each of said memory blocks, said control logic being arranged to control said anti-fuse cells to disconnect defective ones of said memory blocks.

According to another aspect of the present invention, there is provided a read only memory comprising an array of memory cells, each memory cell storing at least one bit of data, and comprising the above programmable anti-fuse circuitry, wherein each memory cell comprises at least one of said anti-fuse cells for storing at least one bit of data.

According to yet another aspect of the present invention, there is provided a method of programming anti-fuse circuitry comprising at least one anti-fuse cell comprising first and second anti-fuse devices coupled to a first node, said first anti-fuse device also coupled to a supply voltage and said second anti-fuse device also coupled to a ground voltage, the method comprising: applying a programming voltage at said first node for breaking down one of said first and second anti-fuse devices, said programming voltage having one of at least two voltage levels comprising: a first voltage level for breaking-down said first anti-fuse device but not said second anti-fuse device and coupling said first node to said supply voltage; and a second voltage level for breaking-down said second anti-fuse device but not said first anti-fuse device and coupling said first node to said ground voltage.

According to an embodiment of the present invention, the method further comprises, prior to applying said programming voltage, applying a soft programming voltage at said first node, said soft programming voltage being at one of two levels to simulate the effect of hard programming of said anti-fuse cell without causing break-down of said first and second anti-fuse devices.

According to another embodiment of the present invention, the method further comprises, after said step of applying said control voltage, the step of reducing said supply voltage such that said supply voltage is lower than a voltage needed to break-down said anti-fuse devices.

BRIEF DESCRIPTION OF THE FIGURES

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
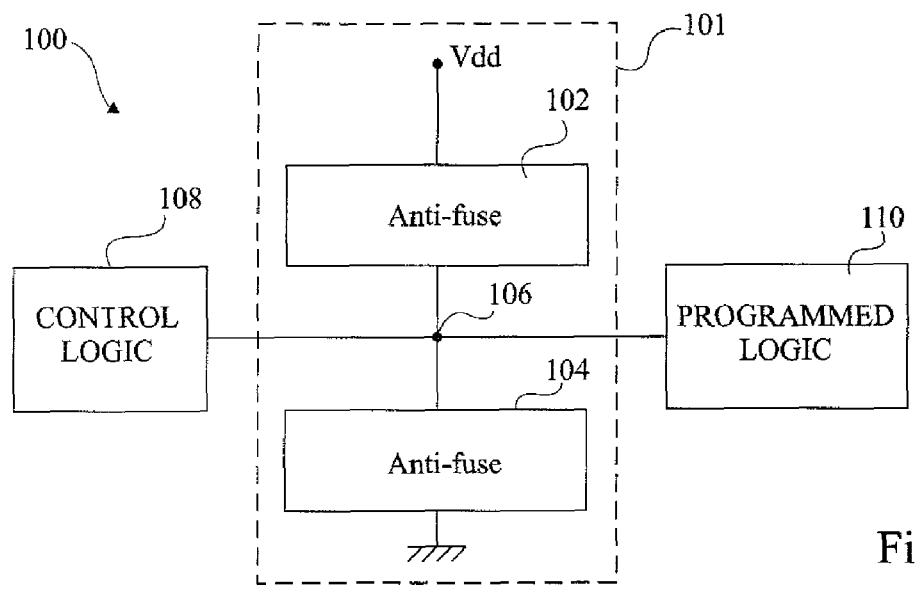
FIG. 1 illustrates anti-fuse circuitry according to an embodiment of the present invention.

FIG. 1 illustrates anti-fuse circuitry 100, comprising an anti-fuse cell 101 comprising a pair of anti-fuses 102 and 104. Anti-fuse 102 is coupled between a supply voltage Vdd and a node 106, while anti-fuse 104 is coupled between node 106 and ground. Node 106 is also coupled to control logic 108, which programs the anti-fuses 102 and 104. Node 106 is further coupled to programmed logic 110, which is, for example, in any circuitry arranged to act in response to the states of the anti-fuses 102 and 104.

Anti-fuses 102 and 104 are each open prior to programming, in other words isolating node 106 from the supply voltage Vdd and from ground. During a programming phase, one or the other of the anti-fuses 102, 104 is broken-down, such that node 106 is coupled to either the supply voltage Vdd or to ground. To achieve this, control logic 108 applies a programming voltage to node 106. Anti-fuses 102 and 104 do not require high voltages to cause break-down as break-down is for example performed by an effect known as snap-back, which can occur at normal operating voltages. In particular, in this example, Vdd is sufficient to break-down anti-fuse 102 when zero volts is applied to node 106, and likewise fuse 104 can be broken-down when Vdd is applied to node 106. Voltage Vdd is for example at approximately 5 V during the programming phase, and reduced during operation of the circuit, typically to the nominal voltage of the technology, for example around 3 V, such that once the fuses have been programmed, Vdd is no longer high enough to cause break-down.

The structure of FIG. 1 is advantageous due to the fact that in operation, irrespective of which of the anti-fuses 102 or 104 is broken, no current flows from Vdd to ground.

Figure 2:
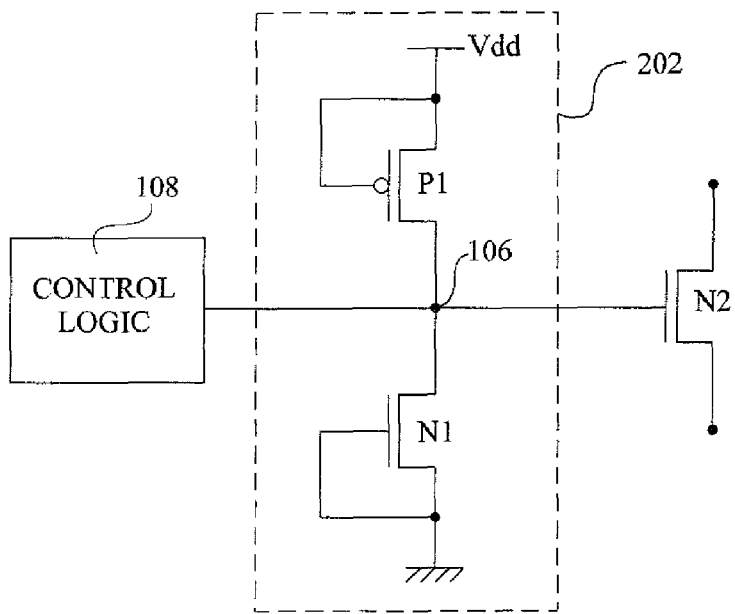
FIG. 2 illustrates the anti-fuse circuitry of FIG. 1 in more detail according to an embodiment of the present invention.

FIG. 2 illustrates anti-fuse circuitry 100 in more detail according to one example in which anti-fuse 102 comprises a P-channel MOS transistor, in particular a gate coupled P-MOS (GCPMOS) transistors P1, and anti-fuse 104 comprises an N-channel MOS transistor, and in particular a gate coupled N-MOS (GCNMOS) transistor N1. Both transistors P1 and N1 have a source node coupled to their respective gates. The source of P1 is also connected to Vdd, and the source of N1 is also connected to ground. The drain nodes of P1 and N1 are coupled together at node 106. Transistors P1 and N1 are preferably thin oxide MOS devices and together form an anti-fuse cell 202. A further transistor N2 is provided with its gate coupled to node 106. This transistor forms part of the programmed logic which senses the state of the anti-fuses 102 and 104. Preferably, transistor N2 is a thick gate oxide NMOS device. In alternative embodiments N2 could be a PMOS device.

The behavior of gate-coupled transistors N1 and P1 when a high voltage is applied between their source and drain nodes for a relatively short time period, for example for less than 1 μs, is different from the normal operating conditions of a MOS device, as will be described with reference to FIG. 3.

Figure 3:
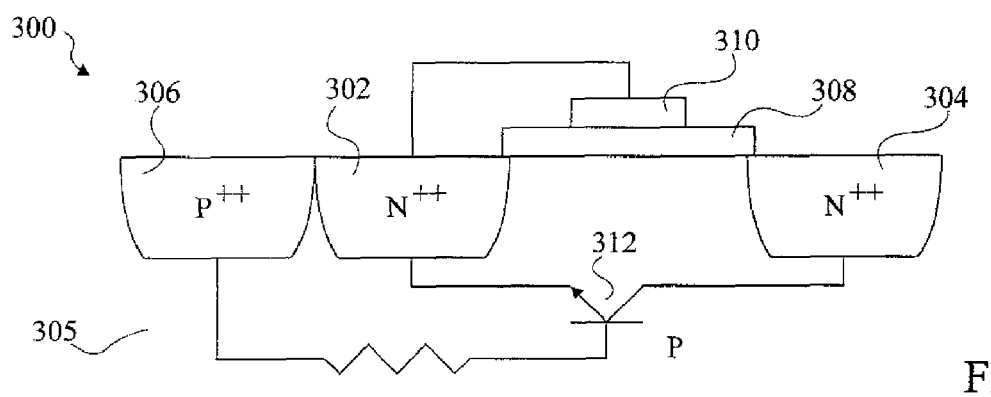
FIG. 3 illustrates a CMOS device when connected according to an embodiment of the present invention.

FIG. 3 illustrates a GCNMOS 300, which comprises heavily doped N-type source region 302, heavily doped N-type drain region 304, and P-type substrate 305, having a heavily doped P-type contact 306. A polysilicon insulating layer 308 is formed between the source and drain contacts, and a gate node 310 is formed over polysilicon region 308, and coupled to the source region 302. The substrate, source and gate contacts are all coupled to ground in this example. When a positive pulse is applied to the drain 304, for example of approximately 5V, the device can be considered to comprise a parasitic NPN bipolar transistor 312, having respective current terminals coupled to respective source 302 and drain 304, and a gate node coupled to the substrate contact 306. The positive pulse applied to the collector of the bipolar transistor 312 (drain region 304) reverses the collector base junction, until an avalanche of the junction, at which point the current increases due to impact ionization, increasing at the same time the transistor base potential until the forward biasing of the emitter-base junction. The forward biasing of the emitter-base junction triggers the bipolar effect and generates snap-back of the transistor. Thus the voltage and current across the device increases until destruction of the bipolar transistor. When such damage occurs, after bipolar snapback, the result is a short-circuit between the drain and source of the device (collector and emitter of bipolar 312).

It will be apparent from FIG. 3 that the gate 310, which is coupled to source region 302, is not directly involved in the snapback effect and could be omitted in alternative embodiments.

Referring again to FIG. 2, Vdd during the programming phase is for example at 5 V and ground at 0 V. Programming is then performed by the control logic, which applies either a voltage of approximately 0 V or approximately 4 V to node 106. When the voltage at node 106 is 0 V, the voltage of Vdd, which is approximately 5 V, is sufficient to cause snapback of the transistor, thus shorting node 106 to Vdd. Once snapback of P1 has occurred, Vdd is reduced to a voltage that will not cause snapback of N1, for example to around 3 V, and the low voltage applied at node 106 is removed, such that node 106 now stays permanently at Vdd.

On the other hand, when a voltage of approximately 4 V is applied to node 106, the voltage between node 106 and Vdd is then only approximately 1 V, which will not cause snapback of transistor P1, whereas the voltage between the node 106 and the ground is 4 V, which is sufficient to cause snapback of N-channel MOS transistor N1, shorting node 106 to ground. Once snapback of N1 has occurred, or even beforehand, the voltage Vdd is reduced to a voltage that will not cause snap-back of P1, for example to 3V.

According to an alternative embodiment, the voltage between Vdd and ground can be permanently lower than the level needed to cause snapback of one of the transistors, and a voltage at node 106 can be applied that increases the voltage across one transistor to cause snapback, and causes a small negative voltage across the other transistor. For example, Vdd can be permanently at 4 V, and the ground voltage at 1 V, meaning a 3 V difference between ground and Vdd, which is not enough to cause snapback of the transistors. Then, a programming voltage of 0 V at node 106 would apply 4 V across P1 and thereby cause snapback of P1, and −1 V across N1, having no effect on N1. Once the programming voltage is removed, node 106 will be at 4 V, which is not enough to cause snapback of N1 when ground is at 1 V. On the other hand, a programming voltage of 5 V at node 106 would result in a voltage of 4 V across N1, and −1 V across P1, causing snapback in N1, but no effect in P1. Once the programming voltage is removed, node 106 will be at 1 V, which is not enough to cause snapback of P1 when Vdd is at 4 V. N2 is arranged to be turned on by a voltage of 4 V at its gate node, but not a voltage of 1 V. An advantage of this embodiment is that the supply voltage Vdd and the ground voltage can remain constant throughout operation of the anti-fuse circuitry.

According to some embodiments, the control logic 108 can have a soft programming mode of operation, in which the anti-fuse cell 101 or 202 is "soft programmed" before being programmed permanently. This can be achieved by applying voltages at node 106 that are high enough to cause a change of state in the programmed logic 110 or switch transistor N2, but are not high enough to cause hard programming of either of the anti-fuses, such as snapback of transistors N1 or P1. For example, in the case described above in which Vdd is at 4 V, ground at 1 V, and the programming voltages are at 0 V and 5 V, the soft programming voltages are for example at 1 V and 4 V. Soft programming advantageously allows circuit functionality to be tested prior to hard programming.

Figure 4:
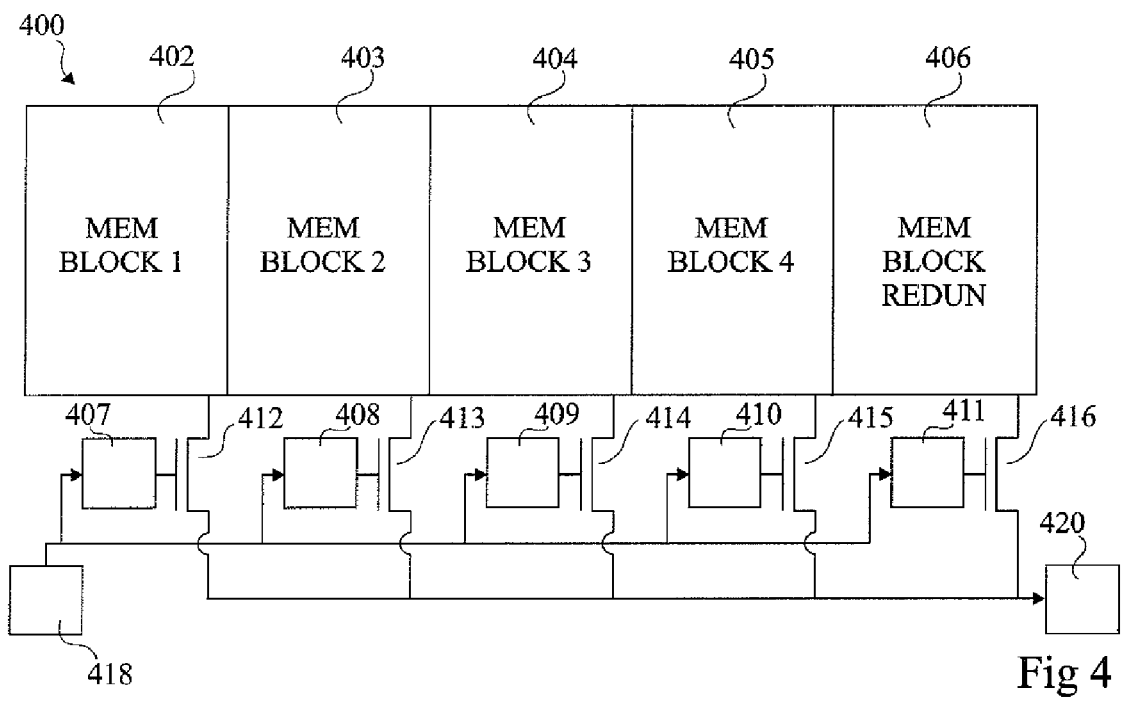
FIG. 4 illustrates a memory comprising anti-fuse cells according to an embodiment of the present invention.

FIG. 4 illustrates a memory circuit 400 comprising four memory blocks 402, 403, 404 and 405, and a redundant memory block 406. Memory circuit 400 is for example a 1 MB memory, and each memory block 402 to 406 for example comprises 256 KB of memory. During manufacture of the memory circuit, the memory blocks 402 to 406 are formed, and at the same time, anti-fuse cells 407 to 411 are formed, each associated with respective ones of the memory blocks 402 to 406. Each anti-fuse cell 407 to 411 for example comprises the anti-fuse cell 101 of FIG. 1 or 202 of FIG. 2. The output of each of the anti-fuse cells 407 to 411 is coupled to the gate terminal of the respective NMOS transistor 412 to 416. NMOS transistors 412 to 416 have their main current terminals coupled between respective memory blocks 402 to 406 and logic block 420, which is arranged to communicate with the memory blocks. Each of the anti-fuse cells 407 to 411 is controlled by a control logic block 418.

During fabrication of the memory circuit 400, each of the memory blocks 402 to 405 is tested, to check that they are functional. For example, soft programming of the anti-fuse cells as described above could be used to soft program cells 407 to 411 to select memory blocks for testing.

In the case that all these memory blocks are functional, then the control logic block 418 controls anti-fuse cells 407 to 410 with a corresponding programming voltage such that the gates of transistors 412 to 415 are coupled to Vdd, and these transistors are permanently on, while anti-fuse cell 411 is controlled such that the gate terminal of transistor 416 is coupled to ground, isolating the redundant memory block 406 from the logic 420. On the other hand, if during verification, one of the memory blocks 402 to 405 is found to be faulty, it is isolated from the logic block 420 rather than the redundant memory being isolated, and the redundant memory block 406 can be coupled to the logic block 420 by programming anti-fuse cell 411 to couple the gate node of transistor 416 to Vdd.

Figure 5:
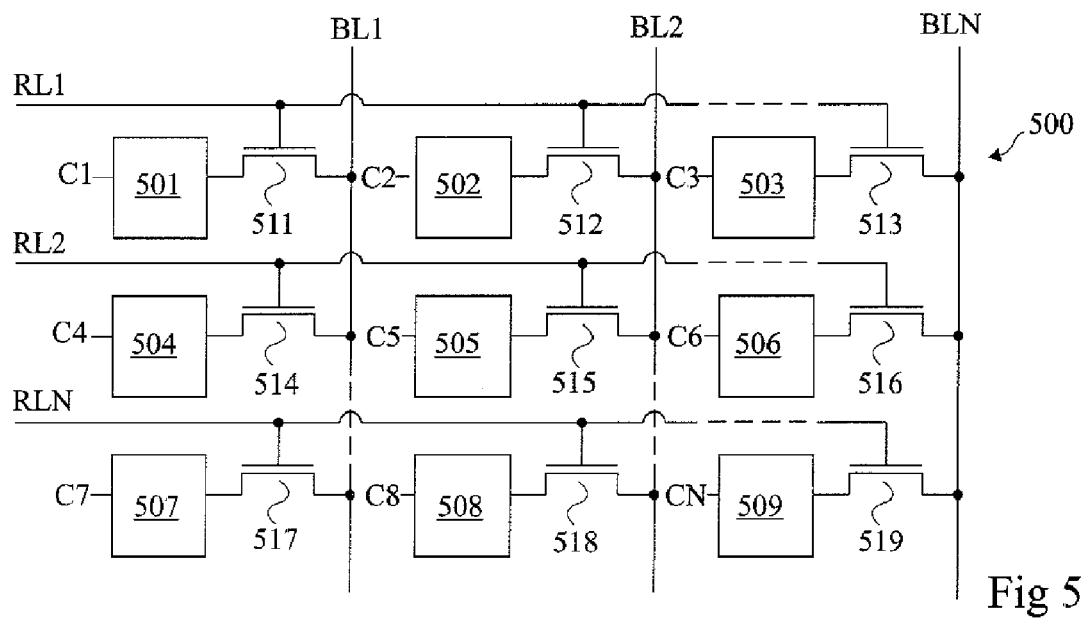
FIG. 5 illustrates a further memory circuit comprising anti-fuse fuse cells according to an embodiment of the present invention.

FIG. 5 illustrates a memory circuit 500 in which anti-fuse cells 501 to 509 are used as a ROM (read-only memory). Each anti-fuse cell 501 to 509 for example comprises the anti-fuse cell 101 of FIG. 1 or 202 of FIG. 2. The output of each anti-fuse cell 501 to 509 is coupled to the main current terminal of a respective transistor 511 to 519. The other main current terminals of transistors 511 to 519 are coupled to one of a number of bit lines B1 to BN. In particular, transistors 511, 514 and 517 are coupled to bit line BL1, transistors 512, 515 and 518 are coupled to bit line BL2, while transistors 513, 516, and 519 are coupled to bit line BLN, which is the last bit line in the memory. The memory may comprise many more columns of anti-fuse cells and associated bit lines not shown in FIG. 5 between BL2 and BLN. Furthermore, the gate terminals of transistors 511 to 519 are coupled to read lines RL1 to RLN. In particular, the gates of transistors 501 to 503 are coupled to RL1, the gates of transistors 504 to 506 are coupled to RL2, and the gates of transistors 507 to 509 are coupled to RLN. The memory may comprise further rows of anti-fuse cells and corresponding read lines between RL2 and RLN, not shown in FIG. 5.

Each anti-fuse cell 501 to 509 comprises a corresponding control input C1 to C9, which is used to program the cells during a programming phase.

In operation, during the programming phase, control signals C1 to CN are asserted either high or low to program one bit of data into each of the anti-fuse cells 501 to 509. The cells are programmed to store read only memory data. This data can be read from the memory cells row by row, by applying a high signal to one of read lines RL1 to RLN, and detecting the voltage outputs on bit lines BL1 to BLN. In some embodiments, to allow verification, the anti-fuse cells could be soft programmed, as described above, before being hard programmed.

Figure 6:
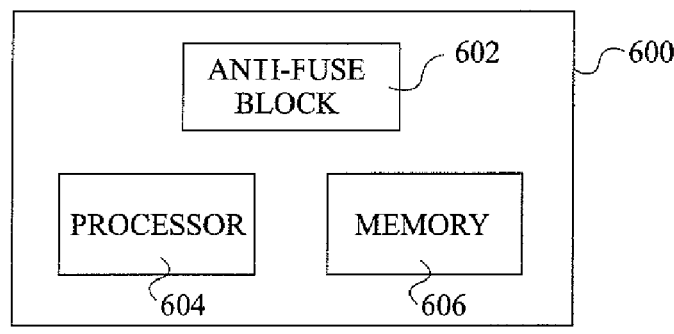
FIG. 6 illustrates an electronic device comprising anti-fuse circuitry according to an embodiment of the present invention.

FIG. 6 illustrates an electronic device 600, comprising an anti-fuse block 602, a processor 604 and memory 606, and can comprise other circuitry, for example input devices such as keyboards, output devices such as displays, etc. Electronic device 600 is for example a mobile telephone, game console, PC, electronic organiser, set-top box or any other electronic device. Anti-fuse block 602 comprises anti-fuse circuitry, for example as shown in FIG. 1 or 2, and/or the memory of FIG. 4 or 5 allowing an aspect of the electronic device to be programmed after the process flow for forming integrated circuits of the device.

Thus anti-fuse circuitry has been described that advantageously comprises first and second anti-fuse devices, the first anti-fuse device coupled between a supply voltage and a first node and the second anti-fuse device coupled between the first node and a ground voltage. The supply voltage and the ground voltage are chosen such that a first voltage level applied at the first node causes break-down of the first anti-fuse device but not the second anti-fuse device, whereas a second voltage level applied to said first node causes breakdown of the second anti-fuse device but not the first anti-fuse device. The advantage of this arrangement is that the fuse can be programmed by a single voltage and once programmed has a very low power consumption as current will not flow from Vdd to ground. Furthermore, the elementary anti-fuse cell can also be easily arrayed.

The anti-fuse devices are preferably thin oxide gate coupled MOS devices. Thin oxide gates are advantageously less robust than thick oxide devices. The sense transistor for sensing the voltage at the first node is preferably a thick oxide device.

An advantage of the use of gate coupled MOS devices is that less chip area is needed when compared to the other known solutions described above. In particular, implementation of the circuit arrangement of FIG. 2, for example in 65 nm CMOS technology, can be achieved using a simple arrangement, for example with P1 and N1 each comprising ten fingers and having widths W of approximately 2.5 µm and lengths L of approximately 60 nm. This can result in a total area of a one bit anti-fuse cell of only approximately 22 µm$^2$.

Furthermore, in a CMOS structure, the use of gate coupled MOS devices is advantageous as these are standard components, and thus no specific technology needs to be developed and integrated with CMOS.

Advantageously, the anti-fuse cell described herein is also capable of being soft programmed, such that the circuit operation can be determined without actually programming the cell. This is because the control logic that applies the programming signal can be adapted to also provide lower control voltages to control the programmed logic 110 or the sense transistor N2 without causing break-down of either anti-fuse device.

Advantageously, the anti-fuse cells described herein can be implemented at the voltage levels commonly seen in CMOS technology, and therefore do not require high voltage components.

According to a further advantage, due to the complementary programming of the first and second anti-fuses of the anti-fuse cell, the leakage of the system is very low.

Having thus described at least one illustrative embodiment of the invention, various alterations, modifications and improvements will readily occur to those skilled in the art.

For example, while the example of an anti-fuse cell comprising gate-coupled MOS transistors has been given, in alternative embodiments the anti-fuse could comprise other devices, such as silicon structures corresponding to CMOS devices without the metal gate. Furthermore, in the particular examples, NMOS transistors could be exchanged for PMOS transistors, or vice-versa.

Furthermore, while two examples of applications of the anti-fuse circuitry have been provided, there are many other possible applications, in a large range of electronic devices.

It will be apparent that while particular examples of the supply voltage, ground voltage, and the soft and hard programming voltages have been provided, many alternative voltages could be used, depending on the particular technology, the types of devices, and power source available. It is only desirable that the hard programming voltages each cause break-down in just one of the anti-fuses.

Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. Programmable anti-fuse circuitry comprising:
   at least one anti-fuse cell comprising a first anti-fuse device coupled between a supply voltage and a first node and a second anti-fuse device coupled between the first node and a ground voltage; and
   control logic coupled to the first node and arranged to generate a programming voltage having one of at least:
   a first voltage level for breaking-down said first anti-fuse device but not said second anti-fuse device and coupling said first node to said supply voltage; and
   a second voltage level for breaking-down said second anti-fuse device but not said first anti-fuse device and coupling said first node to said ground voltage;
   wherein said first anti-fuse device comprises source and bulk regions coupled to said supply voltage and a drain region coupled to said first node, and wherein said second anti-fuse device comprises source and bulk regions coupled to said ground voltage and a drain region coupled to said first node.

2. The programmable anti-fuse circuitry of claim 1, further comprising a MOS transistor having its gate coupled to said first node and arranged to sense the voltage at the first node.

3. A memory circuit comprising:
   a plurality of memory blocks; and
   programmable anti-fuse circuitry according to claim 1, comprising at least one of said anti-fuse cells associated with each of said memory blocks, said control logic being arranged to control said anti-fuse cells to disconnect defective ones of said memory blocks.

4. A read only memory comprising an array of memory cells, each memory cell storing at least one bit of data, and comprising the programmable anti-fuse circuitry of claim 1, wherein each memory cell comprises at least one of said anti-fuse cells for storing at least one bit of data.

5. A method of programming anti-fuse circuitry comprising at least one anti-fuse cell comprising first and second anti-fuse devices coupled to a first node, said first anti-fuse device also coupled to a supply voltage and said second anti-fuse device also coupled to a ground voltage, the method comprising:
   applying a programming voltage at said first node for breaking-down one of said first and second anti-fuse devices, said programming voltage having one of at least two voltage levels comprising:
   a first voltage level for breaking-down said first anti-fuse device but not said second anti-fuse device and coupling said first node to said supply voltage; and
   a second voltage level for breaking-down said second anti-fuse device but not said first anti-fuse device and coupling said first node to said ground voltage;
   wherein said first anti-fuse device comprises source and bulk regions coupled to said supply voltage and a drain region coupled to said first node, and wherein said second anti-fuse device comprises source and bulk regions coupled to said ground voltage and a drain region coupled to said first node.

6. Programmable anti-fuse circuitry comprising:
   at least one anti-fuse cell comprising a first anti-fuse device coupled between a supply voltage and a first node and a second anti-fuse device coupled between the first node and a ground voltage; and
   control logic coupled to the first node and arranged to generate a programming voltage having one of at least:
   a first voltage level for breaking-down said first anti-fuse device but not said second anti-fuse device and coupling said first node to said supply voltage; and
   a second voltage level for breaking-down said second anti-fuse device but not said first anti-fuse device and coupling said first node to said ground voltage;
   wherein said first and second anti-fuse devices each comprise a gate coupled MOS device, said gate coupled MOS devices arranged such that said programming voltage causes snapback in one or the other of them.

7. Programmable anti-fuse circuitry comprising:
at least one anti-fuse cell comprising a first anti-fuse device coupled between a supply voltage and a first node and a second anti-fuse device coupled between the first node and a ground voltage; and
control logic coupled to the first node and arranged to generate a programming voltage having one of at least:
a first voltage level for breaking-down said first anti-fuse device but not said second anti-fuse device and coupling said first node to said supply voltage; and
a second voltage level for breaking-down said second anti-fuse device but not said first anti-fuse device and coupling said first node to said ground voltage;
wherein the first anti-fuse is formed of a gate-coupled p-channel MOS transistor, while the second anti-fuse is formed of a gate coupled n-channel MOS transistor.

8. Programmable anti-fuse circuitry comprising:
at least one anti-fuse cell comprising a first anti-fuse device coupled between a supply voltage and a first node and a second anti-fuse device coupled between the first node and a ground voltage; and
control logic coupled to the first node and arranged to generate a programming voltage having one of at least:
a first voltage level for breaking-down said first anti-fuse device but not said second anti-fuse device and coupling said first node to said supply voltage; and
a second voltage level for breaking-down said second anti-fuse device but not said first anti-fuse device and coupling said first node to said ground voltage;
wherein said supply voltage and ground voltage are chosen such that the voltage difference between said ground voltage and said supply voltage is lower than a minimum voltage for breaking-down either of said first and second anti-fuse devices, and wherein said first voltage level is lower than said ground voltage and said second voltage level is higher than said supply voltage.

9. A method of programming anti-fuse circuitry comprising at least one anti-fuse cell comprising first and second anti-fuse devices coupled to a first node, said first anti-fuse device also coupled to a supply voltage and said second anti-fuse device also coupled to a ground voltage, the method comprising:
applying a programming voltage at said first node for breaking-down one of said first and second anti-fuse devices, said programming voltage having one of at least two voltage levels comprising:
a first voltage level for breaking-down said first anti-fuse device but not said second anti-fuse device and coupling said first node to said supply voltage; and
a second voltage level for breaking-down said second anti-fuse device but not said first anti-fuse device and coupling said first node to said ground voltage;
further comprising, prior to applying said programming voltage, applying a soft programming voltage at said first node, said soft programming voltage being at one of two levels to simulate the effect of hard programming of said anti-fuse cell without causing break-down of said first and second anti-fuse devices.

10. A method of programming anti-fuse circuitry comprising at least one anti-fuse cell comprising first and second anti-fuse devices coupled to a first node, said first anti-fuse device also coupled to a supply voltage and said second anti-fuse device also coupled to a ground voltage, the method comprising:
applying a programming voltage at said first node for breaking-down one of said first and second anti-fuse devices, said programming voltage having one of at least two voltage levels comprising:
a first voltage level for breaking-down said first anti-fuse device but not said second anti-fuse device and coupling said first node to said supply voltage; and
a second voltage level for breaking-down said second anti-fuse device but not said first anti-fuse device and coupling said first node to said ground voltage;
comprising, after said step of applying said programming voltage, the step of reducing said supply voltage such that said supply voltage is lower than a voltage needed to break-down said anti-fuse devices.

* * * * *